United States Patent [19]

Kapur et al.

[11] Patent Number: 4,581,108
[45] Date of Patent: Apr. 8, 1986

[54] PROCESS OF FORMING A COMPOUND SEMICONDUCTIVE MATERIAL

[75] Inventors: Vijay K. Kapur, Northridge; Uppala V. Choudary, Chatsworth; Alan K. P. Chu, Granada Hills, all of Calif.

[73] Assignee: Atlantic Richfield Company, Los Angeles, Calif.

[21] Appl. No.: 568,674

[22] Filed: Jan. 6, 1984

[51] Int. Cl.[4] .................................................. C25D 5/50
[52] U.S. Cl. ...................................... 204/37.1; 29/572; 136/252; 136/260; 136/262; 136/264; 136/265; 204/40; 204/86
[58] Field of Search ...................... 204/37.1, 56 R, 40, 204/59 R, 86, 92; 136/260, 252, 262, 264, 265; 148/DIG. 120; 29/572

[56] References Cited
U.S. PATENT DOCUMENTS 3,419,484 12/1968 Ammerman et al. .................. 204/86
4,253,919 3/1981 Hall et al. ........................... 204/37 R
4,335,266 6/1982 Mickelsen et al. .................. 136/260
4,376,682 3/1983 Fawcett et al. .................. 204/14 N

OTHER PUBLICATIONS

S. P. Grindle et al., Preparation and Properties of $CuInS_2$ Thin Films . . . , Appl. Phys. Lett., 35(1), Jul. 1, 1979, pp. 24-26.
F. A. Lowenheim, Electroplating, McGraw-Hill Book Co., New York, 1978, pp. 12-14.

Primary Examiner—John F. Niebling
Assistant Examiner—W. T. Leader
Attorney, Agent, or Firm—Roderick W. MacDonald

[57] ABSTRACT

A process of forming a compound semiconductive material having a plurality of constituent elements comprising electrodepositing a plurality of such constituent elements and subsequently heating the deposits to produce the desired semiconductive material.

13 Claims, 8 Drawing Figures

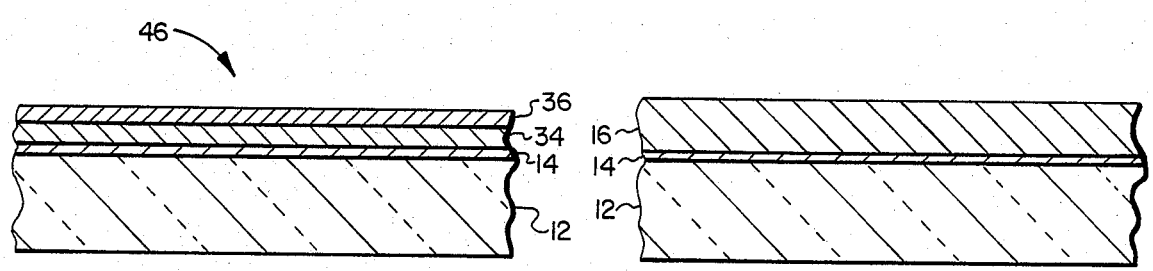
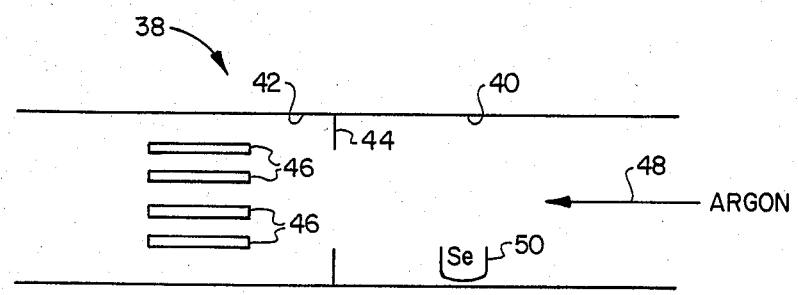
FIG. 4a    FIG. 4b
FIG. 5
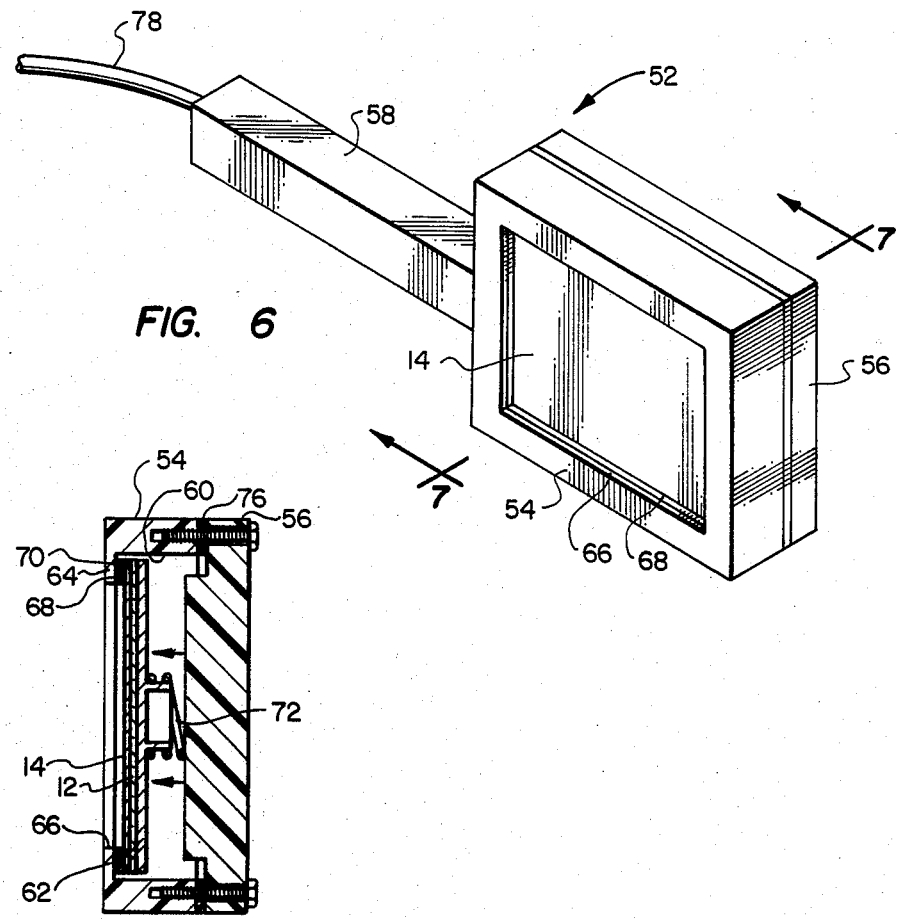
FIG. 6
FIG. 7

PROCESS OF FORMING A COMPOUND SEMICONDUCTIVE MATERIAL

BACKGROUND OF THE INVENTION

This invention relates to the field of solid state electronics and, more specifically, to a process of forming compound semiconductive materials.

A number of compound semiconductive materials are considered promising for use in thin-film photovoltaic devices. $CuInSe_2$ is a good example. It has a band gap ($E_g$) of 1.04 electron volts (eV) and can absorb almost the entire useful spectrum of sunlight at a thickness of less than 1 micron (um). As disclosed in Mickelsen et al., U.S. Pat. No. 4,335,266, efficiencies of over 10% have been reported in thin-film $CuInSe_2$/CdS devices.

$CuInSe_2$ is a defect structure compound having electrical properties which depend dramatically on its composition. It is not easily doped and, in bulk form, exists in many phases. The conductivity type of the material is a function of the ratio of its constituent elements. The material is p-type and has a low resistivity if it is rich in Cu or Se, whereas it is n-type and relatively highly resistive if it is rich in In or deficient in Se, as compared with its normal stoichometric ratio of elements.

The resistivity of $CuInSe_2$ for photovoltaic purposes is so highly dependent upon composition that it is quite difficult to control by the usual deposition methods. This relationship is illustrated in FIG. 2, which is a graphical representation of resistivity as a function of Cu to In ratio. The slope of the resistivity curve changes sharply and, therefore, even minor deviations in the Cu/In ratio produce extreme variations in resistivity.

Mickelson et al., supra, describes a method of obtaining a film of $CuInSe_2$ in two thermal evaporation phases. In the first phase, relatively low resistivity (Cu-rich) p-type material is evaporation deposited at 400° C. as a first film, followed by evaporation deposition at 450° C. of a film of relatively high resistivity (Cu-deficient) n-type material. The homojunction at the interface of the films is then eliminated by diffusion. Although efficiencies of 10% have been reported by this method, the geometry and control mechanisms required for evaporation deposition of the two films are exceedingly complex, and are not readily adaptable to use on a commercial scale or at commercial production rates necessary for low cost solar cells.

Similarly, CdTe/CdS solar cells have been proposed, but the known methods of producing them are not ideal. Cells of this type are described in Tyan, U.S. Pat. No. 4,207,119, and Nakayama et al., "Screen Printed Thin Film CdS/CdTe Solar Cell", *Japanese Journal of Applied Physics*, Vol. 19, No. 4, pp. 703-712 (1980). In each case, the semiconductive layers are deposited in compound form. The Nakayama method involves screen printing the CdS layer as a paste containing Cd and S, firing the paste to form a film of CdS, and repeating the process with a screen printing paste containing Cd and Te. However, this procedure can produce holes and voids in the films due to evaporation of organic components of the pastes.

CdTe has also been electrodeposited in alloy form, as described in Kroger et al., "Cathodic Deposition of CdTe from Aqueous Electrolytes", *J. Electrochem. Soc.*, pp. 566 through 572 (April, 1978) and Fulop et al., U.S. Pat. No. 4,260,427. However, it is extremely difficult to electrodeposit a multinary semiconductor as a compound, due to the widely different electrodeposition potentials of its constituents. The relative deposition rates of the constituents, and therefore the composition of the deposited film, can be controlled only by careful control of the electrolyte and current density distribution within the bath. However, such control is difficult to accomplish on a commercial scale.

In another context, Cd layers have been deposited on Te substrates, as described in Yokota et al., "Growth of CdTe on Te Substrates by Solid-State Reaction", *Japanese Journal of Applied Physics*, Vol. 13, No. 9, pp. 1757-1766 (1979). Upon annealing, interdiffusion produced a region of CdTe at the interface between the substrate and the Cd layer.

Also of interest is a process described in Grindle et al., "Preparation and Properties of $CuInS_2$ Films Produced by Exposing RF-Sputtered Cu-In Films to an $H_2S$ Atmosphere", *Appl. Phys. Lett.* 35(1), pp. 24-26 (July, 1979). A film sputtered from an alloy of Cu and In was heated in the presence of $H_2S$ gas diluted with argon, causing S to enter the film from the gas phase to produce $CuInS_2$.

None of the prior art processes described above provides the economy and level of control desired in the manufacture of thin film solar cells, particularly multinary materials such as $CuInSe_2$. Therefore, it is desirable to provide a highly controllable, large volume process for forming very precise compound semiconductive materials from their constituent elements.

SUMMARY OF THE INVENTION

This invention relates to a process of forming a compound semiconductive material having a plurality of constituent elements, comprising: forming by electrodeposition on a substrate a first deposit containing at least one of the constituent elements; forming by electrodeposition on or with the first deposit a second deposit containing at least one other constituent element; and heating same to produce a semiconductive material. The deposits can be formed either simultaneously with one another or sequentially of one another. In one embodiment, the heating step comprises heating the deposits in a reactive atmosphere containing a further constituent element of the semiconductive material. The semiconductive material can be $CuInSe_2$, CdTe or other suitable compound semiconductor materials as further described hereinafter.

An important aspect of the process of the present invention is exceedingly accurate control over the stoichiometric makeup of the compound semiconductive product. Because the constituent elements can be deposited as discrete deposits such as films, a high degree of deposition control can be achieved as to the quantity of each constituent element deposited. Also, the deposition of one constituent element is not complicated nor constrained by concurrent or sequential deposition of another constituent element or elements. The amount of each constituent element is determined by the thickness of the corresponding deposit and is unchanged by other depositions of other constituent elements or heat treatments. Upon heat treatment, the constituent elements can interdiffuse and chemically react with each other in the solid phase to produce a thin homogeneous deposit such as a film of the compound semiconductive material, and optionally including a further constituent element from the atmosphere in which it was heated. For example, Cu and In can be separately deposited and then heated in a reactive atmosphere of $H_2Se$, to yield a homogeneous thin film of CuInSe$_2$ in which the ratio of Cu to In is very precisely controlled. Resistivity of the material is controlled in this way, thereby obviating the need for depositing two discrete compositions of CuInSe$_2$ in the manner required by Mickelsen et al.

The constituent elements are deposited by electrodeposition (except in the reactive atmosphere embodiment) in which electrical current and time can be controlled rather easily to within milliamperes ($10^{-3}$ amps) and milliseconds ($10^{-3}$ sec.), respectively. Thus, the charge transferred in the deposition process can be controlled to within $10^{-6}$ coulombs. Assuming a single charge or "first order" reaction, and recognizing that one coulomb represents $6.25 \times 10^{18}$ electrons, the electrodeposition reaction is easily controllable to within approximately $10^{13}$ atoms. In practice, current and time can be controlled to much less than milliamperes and milliseconds, allowing even better control of the number of atoms deposited. By comparison with these figures, a film one square centimeter in area and one atom thick would contain approximately $10^{15}$ atoms, assuming an atomic diameter between 3 and 4 angstroms.

Diffusion of constituent elements by the process of the present invention takes place at a temperature much lower than the melting point of the compound semiconductive material being formed. For example, CuInSe$_2$ has a melting point of approximately 1000 degrees Celsius (°C.) but its constituent elements can be diffused together to form the same material at a temperature of approximately 400° C. The product is a polycrystalline thin film of small grain size (from about 1 to above 5 microns) which is well suited for use in a CuInSe$_2$/CdS photovoltaic device.

In the heating step of the present invention, diffusion and chemical reaction take place essentially simultaneously in the solid phase to produce the desired compound semiconductive material. In this context, the phrase "constituent element" refers to one of the basic chemical constituents of the semiconductive material, e.g., Cu in CuInSe$_2$, and not to a mere dopant or interstitial component. The process of the present invention is thus much different than simple diffusion as encountered in many solid state doping processes.

The process of this invention is designed for formation of very thin semiconductive deposits such as films, preferably films between one and five microns (um) thick, but can be used in the production of films up to at least 10 microns thick, as well. This invention is ideally suited for use in the formation of CuInSe$_2$ because Cu and Se are both very fast diffusers. Any required homogeneity of the compound semiconductor product can thus be achieved in a relatively short period of time.

BRIEF DESCRIPTION OF THE DRAWINGS

The above and other features of this invention may be more fully understood from the following detailed description, taken together with the accompanying drawings, wherein similar reference characters refer to similar elements throughout and in which:

FIG. 4a is an enlarged fragmentary sectional view illustrating the structure of FIG. 1 at an intermediate stage in its formation;

FIG. 4b is an enlarged fragmentary sectional view of the solar cell of FIG. 1 at a stage in its formation later than FIG. 4a;

FIG. 5 is a diagrammatic representation of a diffusion furnace useful in forming the solar cell of FIG. 1;

FIG. 6 is a perspective view of a substrate holder used in the process of this invention; and FIG. 7 is an enlarged fragmentary vertical sectional view taken along line 7—7 of FIG. 6.

DESCRIPTION OF THE PREFERRED EMBODIMENTS

Figure 1:
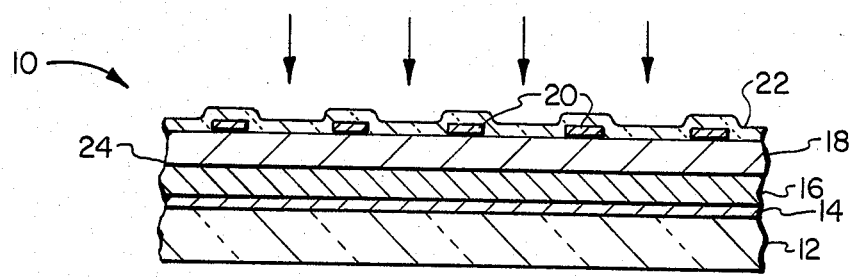
FIG. 1 is a fragmentary vertical sectional view of a solar cell constructed according to one embodiment of this invention.
Figure 2:
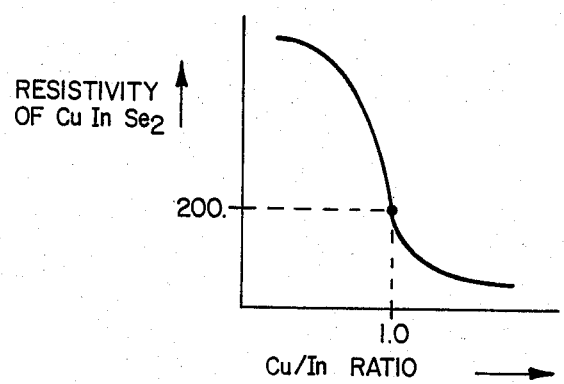
FIG. 2 is a graphical representation of the resistivity of CuInSe$_2$ as a function of the ratio of Cu atoms to In atoms in the material and constant Se content.

Referring now to FIG. 1, there is illustrated a thin film solar cell 10 constructed according to one embodiment of this invention. Cell 10 comprises a substrate 12, a metallic back contact 14, a pair of stacked p and n-type layers 16 and 18, respectively, and a front electrode 20. An antireflective (AR) coating 22 may be applied to the upper surface of the cell 10. Layers 16 and 18 are thin film semiconductive layers which define a photovoltaic junction 24 for transforming incoming radiation (hv) into an appropriate electrical signal to be recovered by way of electrodes 14 and 20. Either of layers 16 or 18, or both, may be made of a compound semiconductive material produced by the process of this invention. The speed and controllability of the process make the solar cell inexpensive to manufacture but yet very high in quality.

The process of this invention involves electrodeposition of a plurality of deposits containing different constituent elements of the desired compound semiconductive material, and subsequent heating of the films to produce such semiconductive material, e.g., as an essentially homogeneous layer produced by interdiffusion and chemical reaction of the constituent elements. The heating process may be conducted in an inert atmosphere or a reactive atmosphere containing yet another constituent element of the semiconductor so that the constituent element in the atmosphere also enters the deposits and reacts to form the desired semiconductor.

Figure 3:
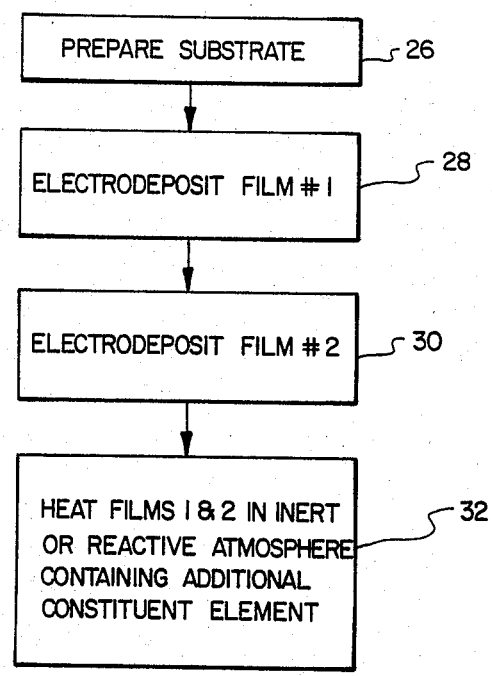
FIG. 3 is a simplified flow chart depicting one process useful in forming the solar cell of FIG. 1 according to this invention.

FIG. 3 illustrates a series of steps 26 through 32 for implementing the process of this invention. In the context of cell 10 of FIG. 1, step 26 involves cleaning and preparing substrate 12 for application of the back contact 14 thereto. Substrate 12 is a supporting material which can be either electrically conductive or nonconductive, for example, metal, glass, ceramic, or other low cost material. If the substrate is nonconductive, then an electrically conductive layer is formed thereon to serve as an electrode in the later electrodeposition steps. For example, if alumina (Al$_2$O$_3$) is substrate 12, contact 14 can be a thin film of molybdenum (Mo) or other suitable metal. Film 14 may be applied by sputtering or other suitable method to a depth, for example, of from about 1.0 to about 1.5 microns.

After substrate 12 and back contact 14 have been prepared, two constituent elements of layer 16 are sequentially deposited thereon, as indicated by steps 28 and 30. The resulting configuration is illustrated in FIG. 4a, wherein films 1 and 2 are designated 34 and 36, respectively. The films are each at least approximately 3,000 angstroms thick. When CuInSe$_2$ is the compound semiconductive material of layer 16, films 34 and 36 comprise Cu and In, respectively, and are each deposited in accordance with this invention, by electrodeposition. In this embodiment, films 34 and 36 are deposited sequentially and in independent fashion, so that the resulting films are substantially discrete.

After deposition, films 34 and 36 are heated for a time sufficient to cause formation of the semiconductor material, for example, by interdiffusion and chemical reaction of the constituent elements between the films. For electrodeposited films of Cu and In, heating takes place at approximately 400° C. Cu diffuses rapidly at that temperature, while Mo contact 14 remains stationary and intact. During the heating process, the films can be subjected to a reactive atmosphere containing Se. This causes Se to enter the films and react therewith to produce $CuInSe_2$ in precise atomic ratios. As seen in FIG. 4b, film 16 is substantially thicker than combined films 34 and 36 because the third constituent element (Se) of layer 16 is added to the extent that it makes up approximately 50 atomic percent of the final semiconductive material.

The above-described process of "selenization" can be accomplished in numerous ways, for example, in the atmosphere of a diffusion furnace similar to that designated 38 in FIG. 5. Furnace 38 is a flow-through furnace having first and second chambers 40 and 42, separated by baffle 44. A number of samples 46 of FIG. 4a in chamber 42 are heated to a preselected temperature. During the heating process, argon gas 48 is passed through chamber 40 and into chamber 42, carrying with it Se from source 50. Source 50 may be an evaporative deposition boat heated to approximately 200° C., or a source of $H_2Se$ gas (not shown). In either event, samples 46 are subjected to a reactive Se atmosphere during the heating process, permitting Se to diffuse into and react with films 34 and 36. Resulting layer 16 comprises a homogeneous film of $CuInSe_2$ having a thickness of from about 1 to about 3 microns. It is preferred that layer 16 be about 2 microns thick to avoid short circuits due to possible structural defects.

The n-type layer 18 is applied over layer 16, followed by front electrodes 20 and AR coating 22 to finish the cell. When layer 16 is p-type $CuInSe_2$ having a resistivity of from about 20 to about 2000 ohm-centimeters, the n-type layer can be, for example, a CdS layer approximately 3 microns thick. Layer 18 can be applied by evaporation or sputtering, and front electrodes 20 can be applied by evaporation or screen printing.

Highly efficient $CuInSe_2$/CdS solar cells have been made by the process described above. In such cells, Cu and In were electrodeposited as discrete layers on a Mo back contact 14 approximately 1 micron thick. Cu film 34 was deposited from an electrolyte bath having a composition of 0.5 $M(CuSO_4)$+0.8 $M(H_2SO_4)$, at a constant current density of 80 mA per square centimeter. Cu was applied to a thickness of approximately 0.71 mg of Cu over the deposition area. The In film 36 was then applied from a commercially available electrolyte bath of indium sulfamate. Indium was deposited using pulse plating techniques at a base current of 0 and a peak current of 40 milliamperes (mA) per square centimeter. The duration of each pulse was 0.1 seconds, with a rest time of 0.2 seconds between pulses. Film 36 was plated to a thickness of approximately 0.4 microns, representing approximately 1.31 milligrams (mg) of In over the deposition area. Thus, the ratio of Cu to In between layers 34 and 36 was approximately 0.92.

After deposition, films 34 and 36 were placed in diffusion furnace 38 for heating and selenization. Selenization continued for approximately one hour at about 400° C. and autogenous pressure, followed by annealing at the same temperature for approximately two hours. Finally, the furnace was shut off and the films and the substrate were cooled to room temperature under a flow of argon gas. Selenization was accomplished under 1.5% $H_2Se$ gas in argon at a flow rate of 50 cubic centimeters per minute (STP), yielding the compound semiconductive layer 16 depicted in FIG. 4b.

CdS layer 18 of the cell was applied by thermal evaporation over layer 16, to a thickness of approximately 2 microns. For purposes of experimental measurement, front electrode 20 and AR coating 22 were eliminated from the cell in favor of a transparent conductive layer of indium tin oxide (ITO) having a sheet resistivity of 41 ohms per square. The transparent conductive layer overlying the CdS layer 18, formed the front contact of the cell.

Although the method of this invention is described above as including step 32 of heating the film in a reactive atmosphere containing no additional constituent element (Se) of layer 16, it is sometimes desirable to omit this step in favor of electrodepositing each constituent element including Se as a discrete film. The series or stack of three films can then be heated to approximately 400° C. to produce interdiffusion and reaction between the constituent elements, yielding a homogeneous layer having the composition as film 16 described above. Although this technique can be used to form ternary or other multinary compound semiconductors, it can be used to form binary semiconductive materials, such as CdTe, when, for example, an inert atmosphere is used by itself during the heating step.

Representative specific compound semiconductive materials formed by this invention are given in the following table, under the general formulae for the materials formed and the columns of the period table (*CRC Handbook of Chemistry & Physics*, 60th edition, 1979–1980, published by CRC Press) from which their constituent elements are chosen:

| (IIB) (VIA) | (IIIA) (VA) | (IB) (IIIA) (VIA)$_2$ | (IIB) (IVA) (VA)$_2$ |
|---|---|---|---|
| CdO | GaAs | CuInSe$_2$ | ZnSnP$_2$ |
| CdS | InAs | CuInS$_2$ | ZnGeP$_2$ |
| CdSe | InP | CuInTe$_2$ | ZnSiP$_2$ |
| CdTe | GaP | CuAlS$_2$ | CdSnP$_2$ |
| ZnO | AlSb | CuGaSe$_2$ | CdSiAs$_2$ |
| ZnS | | AgInS$_2$ | |
| ZnSe | | AgGaSe$_2$ | |
| ZnTe | | | |

Preferred elements are Zn, Cd, Cu, Ag, B, Al, Ga, In, C, Si, Ge, Sn, P, As, Sb, Bi, S, Se, and Te. The listed materials can be manufactured as thin films by the process of this invention and are useful as one of the semiconductive layers 16 and 18. Alternatively, they can be used in a variety of other structures calling for such films.

As described above in relation to $CuInSe_2$, the electronic properties of many of the listed semiconductive materials are sensitive to changes in the stoichiometric ratio of elements therein. Thus, the electrodeposition method of this invention generally permits the stoichiometric ratio to be much more carefully controlled than prior art procedures. Sequential electrodeposition of the constituent elements provides a carefully defined amount of each element within the final product. The depositions and atomic ratios can be easily controlled because the kinetics of electrodeposition are well understood and sophisticated electroplating systems are commercially available.

A substrate holder 52 for use in electrodepositing the constituents of layer 16 is illustrated in FIGS. 6 and 7. The holder has a frame portion 54, a backing plate 56 and a handle portion 58, of which the portions 54 and 58 are preferably made of a substantially inert and nonconductive material, such as a commercial fluorocarbon polymer. The frame portion defines a chamber 60 for reception of the substrate 12 and a pressure plate 62, and has an inwardly directed flange 64. The flange forms a rectangular opening 66 and carries a resilient seal 68 and a metallic strip 70 facing the chamber. The pressure plate and the substrate are urged outwardly against the flange by a spring 72 confined by the backing plate. The backing plate is sealed to the frame portion by a resilient element 76. In this configuration, the metallic strip 70 contacts the Mo film of the substrate to apply an electrodeposition potential to the film. The seal 68 is located inwardly of the metallic strip 70, providing a fluid seal with the Mo film to isolate the strip from a surrounding electrolyte bath. The strip is preferably made of platinum and is connected to a conductive wire 78 which extends from the handle portion 58 for connection to a suitable power supply (not shown).

In operation, substrate 12, with the Mo contact film 14 applied to the outer surface thereof, is mounted within holder 52 for sequential deposition of the required elements. Peripheral contact to Mo film is achieved through the holder, permitting uniform deposition without establishing permanent electrical connection to the film. With the substrate in place within the holder, it can be moved with the holder from one electrolyte bath to another to deposit films of the different constituent elements. Following electrodeposition, the substrate can be removed from the holder and placed in the furnace 38 of FIG. 5, where it is subjected to the diffusion and reaction processes described above.

It will be understood that electrodeposition according to the process of the present invention can be performed either on a conductive back electrode material, such as contact film 14 of cell 10, or on a transparent conductive oxide layer (not shown). The oxide layer will generally be deposited on glass prior to electrodeposition of the constituent elements, and must be sufficiently conductive to provide a substantially uniform current density distribution during electrodeposition.

Whether the heating step to form the final semiconductive material is carried out in an inert or reactive atmosphere as described hereinabove, the step can be carried out at essentially atmospheric or autogenous pressure and at a temperature of from about 150° to about 550° C. for a time sufficient to form a finite amount of the desired semiconductive material. The inert atmosphere can be provided by any known inert gas such as argon, xenon, helium, and the like, and the reactive atmosphere can be a mixture of an inert gas and the desired amount of reactive constituent or constituents.

Electrodeposition and the conditions for carrying out same are known in the art and, therefore, substantial description of these steps is not necessary to inform the art. However, generally an electrolyte is employed from which the constituents are deposited. The electrolyte composition can vary wiely so long as it is essentially non-deleterious, chemically or physically, to the substrate and can be either aqueous in nature such as an aqueous solution having the constituent element or elements dissolved therein or non-aqueous such as a fused salt containing the constituent element or elements. When an aqueous electrolyte is employed, the electrodeposition step will be carried out at an elevated temperature not essentially greater than about 90° C. When a non-aqueous electrolyte is employed the elevated temperature should not be essentially greater than 500° C. The electrodeposition step can be carried out over a wide variety of electrical current densities but will generally be in the range of from about 1 to about 300 milliamperes per square centimeter.

The various constituent elements will be deposited in the various steps of the process in predetermined, desired stoichiometric ratios which, after the heating step, will produce the final semiconductive material containing the constituent elements in their desired relative atomic ratios, for example, an atomic ratio of 1 Cu/1 In/2 Se.

By employing electrodeposition techniques in the formation of semiconductive materials of the type covered by this invention, very precise control of the relative amounts of the constituent elements present in the final semiconductive material is achieved. Further, with this invention such precise control of constituent element ratios in the final product is accomplished within a processing time period which is rapid as well as precise. Thus, the formation of the precise semiconductive final products of this invention is achieved at a commercially acceptable rate.

From the above, it can be seen that there has been provided a simple and inexpensive process for forming compound semiconductive films of narrowly defined composition.

While certain specific embodiments of the present invention have been disclosed as typical, the invention is, of course, not limited to these particular forms, but rather is applicable broadly to all such variations as fall within the scope of the appended claims.

What is claimed is:

1. A process of forming a compound semiconductive material having a plurality of constituent elements, comprising:
   electrodepositing a layer of a first constituent element on a substrate;
   electrodepositing a layer of a second constituent element on said first layer; and
   thereafter heating said deposited elements in a reactive atmosphere, which contains a further constituent element of the desired semiconductive material to interdiffuse and chemically react the constituent elements to produce said semiconductive material.

2. The process of claim 1 wherein:
   said constituent elements are chosen from the chemical groups IB, IIIA, and VIA, and the semiconductive material formed is at least in part a compound of the formula $(IB)(IIIA)(VIA)_2$.

3. The process of claim 2 wherein:
   said IB elements are selected from the group of Cu and Ag; said IIIA elements are selected from the group of B, Al, Ga, and In; and said VIA elements are selected from the group of S, Se, and Te.

4. The process of claim 2 wherein:
   said constituent elements are Cu, In and Se, respectively; and
   the semiconductive material formed is at least in part $CuInSe_2$.

5. The process of claim 2 wherein:

said semiconductive material is essentially CuInSe$_2$;
said deposited films consist essentially of Cu and In, respectively; and
the reactive atmosphere contains Se as its reactive constituent.

6. The process of claim 2 wherein:
said semiconductive material is essentially CuInSe$_2$;
said deposited films consist essentially of Cu and In, respectively; and
the reactive atmosphere contains H$_2$S as its reactive constituent.

7. The process of claim 1 wherein:
said constituent elements are chosen from the chemical groups IIB, IVA and VA, and the semiconductive material formed is at least in part a compound of the formula (IIB)(IVA)(VA)$_2$.

8. The process of claim 7 wherein:
said IIB elements are selected from the group Zn and Cd; said IVA elements are selected from the group C, Si, Ge, and Sn; and said VA elements are selected from the group P, As, Sb, and Bi.

9. The process of claim 7 wherein:
said constituent elements are Zn, Sn and P, respectively; and the semiconductive material formed is at least in part ZnSnP$_2$.

10. The process of claim 7 wherein:
said semiconductive material is essentially ZnSnP$_2$; the deposited films contain Zn and Sn, respectively, and the reactive atmosphere contains P as its reactive constituent.

11. The process of claim 1 wherein:
said electrodeposition steps are carried out at an electrical current density of from about 1 to about 300 milliames per square centimeter and in an electrolyte which is nondeleterious to said substrate.

12. The method of claim 1 wherein:
said electrodeposition steps are carried out at essentially atmospheric pressure and employing one of an aqueous electrolyte at a temperature not greater than about 90° C. or a nonaqueous electrolyte at a temperature not greater than about 500° C.

13. The method of claim 1 wherein:
said housing step is carried out at essentially atmospheric pressure and a temperature from about 150° to about 500° C. for a time sufficient to form a finite amount of the desired semiconductive material.

* * * * *